United States Patent
Kwak et al.

(10) Patent No.: US 9,519,197 B1
(45) Date of Patent: Dec. 13, 2016

(54) LIQUID CRYSTAL DISPLAY SUBSTRATE AND LIQUID CRYSTAL DISPLAY PANEL HAVING THE SAME

(71) Applicant: Samsung Display Co., Ltd., Yongin-Si, Gyeonggi-Do (KR)

(72) Inventors: Yun-Hee Kwak, Hwaseong-si (KR); Yu-Jin Jeon, Daejeon (KR); Sung-Chul Hong, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/992,136

(22) Filed: Jan. 11, 2016

(30) Foreign Application Priority Data

Jun. 23, 2015 (KR) .......... 10-2015-0088976

(51) Int. Cl.
| | |
|---|---|
| H01L 27/12 | (2006.01) |
| G02F 1/1362 | (2006.01) |
| G02F 1/1368 | (2006.01) |
| G02F 1/1343 | (2006.01) |

(52) U.S. Cl.
CPC ....... *G02F 1/136286* (2013.01); *G02F 1/1368* (2013.01); *G02F 1/134309* (2013.01); *H01L 27/124* (2013.01)

(58) Field of Classification Search
CPC .............. G02F 1/136286; G02F 1/134309; G02F 1/1368; H01L 27/124
See application file for complete search history.

(56) References Cited

U.S. PATENT DOCUMENTS

| | | | |
|---|---|---|---|
| 6,448,116 B1 | 9/2002 | Wong | |
| 7,808,494 B2 * | 10/2010 | Lee | G02F 1/136286 345/100 |
| 8,665,192 B2 * | 3/2014 | Nagashima | G02F 1/1362 345/84 |

FOREIGN PATENT DOCUMENTS

| | | |
|---|---|---|
| KR | 1020060120878 A | 11/2006 |
| KR | 1020110042668 A | 4/2011 |
| KR | 1020130059181 A | 6/2013 |

* cited by examiner

*Primary Examiner* — David Vu
(74) *Attorney, Agent, or Firm* — Cantor Colburn LLP

(57) ABSTRACT

A liquid crystal display substrate includes a gate line, a data line a switching element and a pixel electrode each provided in plural. The pixel electrodes include first to fourth pixel electrodes. The first pixel electrode is connected to a first gate line and a first data line. The second pixel electrode is connected to the first gate line and a second data line adjacent to the first data line. The third pixel electrode is connected to a second gate line adjacent to the first gate line and the first data line. The fourth pixel electrode is connected to the second gate line and the second data line. The first gate line overlaps the first and second pixel electrodes and the second gate line overlaps the third and fourth pixel electrodes. Sizes of the first to fourth pixel electrodes are different from one another.

20 Claims, 5 Drawing Sheets

LIQUID CRYSTAL DISPLAY SUBSTRATE AND LIQUID CRYSTAL DISPLAY PANEL HAVING THE SAME

This application claims priority to Korean Patent Application No. 10-2015-0088976, filed on Jun. 23, 2015, and all the benefits accruing therefrom under 35 USC §119, the content of which in its entirety is herein incorporated by reference.

BACKGROUND

1. Field

Exemplary embodiments relate to a liquid crystal display panel. More particularly, exemplary embodiments relate to a liquid crystal display panel of which a display quality thereof is improved.

2. Description of the Related Art

A liquid crystal display panel may include an array substrate including a plurality of pixel electrodes arranged in a matrix shape, an opposing substrate opposite to the array substrate, and a liquid crystal display layer therebetween. A signal driving part may be configured to apply a desired voltage to the pixel electrodes to drive the liquid crystal display panel. A plurality of liquid crystal molecules in the liquid crystal display layer may be aligned due to an electric field formed by the voltage.

The liquid crystal display panel may include a plurality of color filters which are disposed on the array substrate and/or the opposing substrate. For example, the color filters may include a red filter (R), a green filter (G) and a blue filter (B). The pixel electrodes may overlap the color filters to transmit backlight as red light, green light or blue light according to an alignment of the liquid crystal molecules. A pixel area non-overlapping the color filters may transmit the backlight as white light (W).

In an RGBW pixel structure in which a unit pixel includes a red light transmitting area, a green light transmitting area, a blue light transmitting area and a white light transmitting area, a new pixel structure is desired to reduce a greenish display problem and enhance transmittance and total luminance, simultaneously.

SUMMARY

Accordingly, one or more exemplary embodiment of the invention is provided to substantially obviate one or more problems due to limitations and disadvantages of the related art.

One or more exemplary embodiments provide a liquid crystal display substrate for which a display quality thereof is improved.

One or more exemplary embodiments provide a liquid crystal display panel for which a display quality thereof is improved.

According to exemplary embodiments, a liquid crystal display substrate includes a plurality of gate lines, a plurality of data lines, a plurality of switching elements, and a plurality of pixel electrodes. The gate lines extend in a first direction. The data lines extend in a second direction crossing the first direction. Each of the switching elements is electrically connected to at least one gate line and at least one data line. The pixel electrodes are electrically connected to the switching elements, respectively. The pixel electrodes include a first pixel electrode, a second pixel electrode, a third pixel electrode and a fourth pixel electrode. The first pixel electrode is connected to a first gate line and a first data line. The second pixel electrode is connected to the first gate line to which the first pixel electrode is connected and to a second data line adjacent to the first data line. The third pixel electrode is connected to a second gate line adjacent to the first gate line and to the first data line to which the first pixel electrode is connected. The fourth pixel electrode is connected to the second gate line to which the third pixel electrode is connected and to the second data line to which the second pixel electrode is connected. The first gate line overlaps the first and second pixel electrodes and the second gate line overlaps the third and fourth pixel electrodes. Planar sizes of the first, second, third and fourth pixel electrodes are different from one another.

In exemplary embodiments, the first and second pixel electrodes may be arranged along the first direction and the third and fourth pixel electrodes may be arranged along the first direction and adjacent to the first and second pixel electrodes along the second direction.

In exemplary embodiments, in the second direction, lengths of the first and second pixel electrodes may be substantially the same as each other and lengths of the third and fourth pixel electrodes may be substantially the same as each other. The lengths of the first and second pixel electrodes may be greater than the lengths of the third and fourth pixel electrodes. In the first direction, widths of the first and third pixel electrodes may be substantially the same as each other and widths of the second and fourth pixel electrodes may be substantially the same as each other. The widths of the first and third pixel electrodes may be greater than the lengths of the second and fourth pixel electrodes.

In exemplary embodiments, in order, the first, second, third and fourth pixel electrodes may correspond to first, second, third and fourth color areas.

In exemplary embodiments, the first, second, third and fourth color areas may be red, green, blue and white areas, respectively.

In exemplary embodiments, pixel electrodes adjacent in the second direction may be disposed between two data lines adjacent in the first direction.

In exemplary embodiments, the first and third pixel electrodes adjacent in the second direction may be disposed between the first and second data lines adjacent in the first direction, and the second and fourth pixel electrodes adjacent in the second direction may be disposed between the second data line and a third data line adjacent in the first direction.

In exemplary embodiments, the first color area may be divided into a first upper color area and a first lower color area by the first gate line, and the second color area may be divided into a second upper color area and a second lower color area by the first gate line. The third color area may be divided into a third upper color area and a third lower color area by the second gate line, and the fourth color area may be divided into a fourth upper color area and a fourth lower color area by the second gate line.

In exemplary embodiments, each of the first to fourth pixel electrodes may define a respective one of first to fourth upper pixel electrodes corresponding to the first to fourth upper color areas and a respective one of first to fourth lower pixel electrodes corresponding to the first to fourth lower color areas.

In exemplary embodiments, the first upper pixel electrode and the first lower pixel electrode may be symmetric with respect to the first gate line, and the second upper pixel electrode and the second lower pixel electrode may be symmetric with respect to the first gate line. The third upper pixel electrode and the third lower pixel electrode may be symmetric with respect to the second gate line, and the fourth upper pixel electrode and the fourth lower pixel electrode may be symmetric with respect to the second gate line.

According to exemplary embodiments, a liquid crystal display panel includes a unit pixel provided in plural, a plurality of gate lines, a plurality of data lines, a plurality of switching elements and a plurality of pixel electrodes. The unit pixel includes a first color area, a second color area, a third color area and a fourth color area. The gate lines extend in a first direction. The data lines extend in a second direction crossing the first direction. The pixel electrodes are electrically connected to the switching elements, respectively. The pixel electrodes include a first pixel electrode connected to a first gate line and a first data line, a second pixel electrode connected to the first gate line to which the first pixel electrode is connected and to a second data line adjacent to the first data line, a third pixel electrode connected to a second gate line adjacent to the first gate line and the first data line to which the first pixel electrode is connected, and a fourth pixel electrode connected to the second gate line to which the third pixel electrode is connected and to the second data line to which the second pixel electrode is connected. The first gate line overlaps the first and second pixel electrodes and the second gate line overlaps the third and fourth pixel electrodes. The first to fourth pixel electrodes correspond to the first to fourth color areas of the unit pixel, respectively. Sizes of the first to fourth pixel electrodes are different from one another.

In exemplary embodiments, the first and second color areas may be arranged along the first direction, and the third and fourth color areas may be arranged along the first direction and adjacent to the first and second color areas along the second direction.

In exemplary embodiments, in the second direction, lengths of the first and second color areas may be substantially the same as each other, and lengths of the third and fourth color areas may be substantially the same as each other. The lengths of the first and second color areas may be greater than the lengths of the third and fourth color areas. In the first direction widths of the first and third color areas may be substantially the same as each other, and widths of the second and fourth color areas may be substantially the same as each other. The widths of the first and third color areas may be greater than the widths of the second and fourth color areas.

In exemplary embodiments, in order, the first to fourth color areas may be red, green, blue and white areas.

In exemplary embodiments, among the first to fourth color areas of the unit pixel, color areas adjacent in the second direction are disposed between two data lines adjacent in the first direction.

In exemplary embodiments, the first and third color areas adjacent in the second direction may be disposed between the first and second data lines adjacent in the first direction, and the second and fourth color areas adjacent in the second direction may be disposed between the second data line and a third data line adjacent in the first direction.

In exemplary embodiments, the first gate line may overlap the first and second color areas, and the second gate line may overlap the third and fourth color areas.

In exemplary embodiments, the first color area may be divided into a first upper color area and a first lower color area by the first gate line, and the second color area may be divided into a second upper color area and a second lower color area by the first gate line. The third color area may be divided into a third upper color area and a third lower color area by the second gate line, and the fourth color area may be divided into a fourth upper color area and a fourth lower color area by the second gate line.

In exemplary embodiments, each of the first to fourth pixel electrodes may define a respective one of first to fourth upper pixel electrodes corresponding to the first to fourth upper color areas and a respective one of first to fourth lower pixel electrodes corresponding to the first to fourth lower color areas.

In exemplary embodiments, the first upper pixel electrode and the first lower pixel electrode may be symmetric with respect to the first gate line, and the second upper pixel electrode and the second lower pixel electrode may be symmetric with respect to the first gate line. The third upper pixel electrode and the third lower pixel electrode may be symmetric with respect to the second gate line, and the fourth upper pixel electrode and the fourth lower pixel electrode may be symmetric with respect to the second gate line.

According to one or more exemplary embodiment of the liquid crystal display panel, in a liquid crystal display panel having a red, green, blue and white (RGBW) pixel structure, display quality can be improved.

In particular, by a structure in which R, G, B and W pixel area sizes taken in order decrease gradually, greenish problem can be reduced and total luminance and transmittance can be enhanced.

Also, the same first gate line is arranged to cross the R pixel and G pixel, and the same second gate line is arranged to cross the B pixel and W pixel such that difference of capacitance by the data line and the gate line can be reduced.

By the above-described structure in which every pixel has uniform electrical characteristics, the display quality of the liquid crystal display panel can be improved.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION

Figure 1:
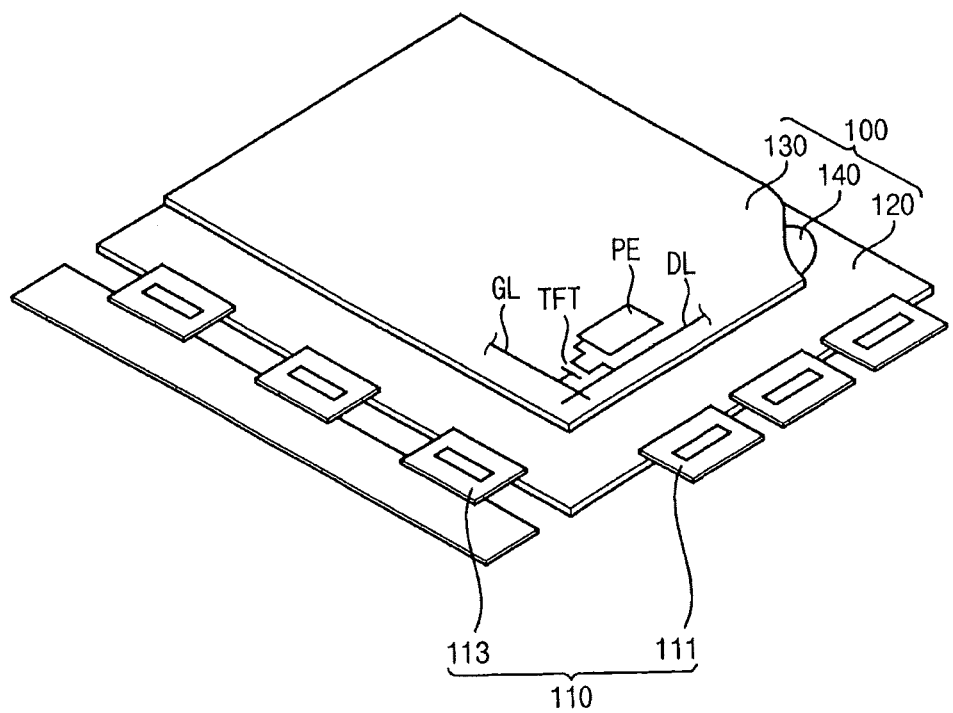
FIG. 1 is a perspective view illustrating an exemplary embodiment of a liquid crystal display panel according to the invention.

The invention will be described more fully with reference to the accompanying drawings, in which embodiments are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. "Or" means "and/or." It will be further understood that the terms "comprises," "comprising," "includes" and/or "including," when used herein, specify the presence of stated features, integers, steps, operations, elements, and/or components, but do not preclude the presence or addition of one or more other.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
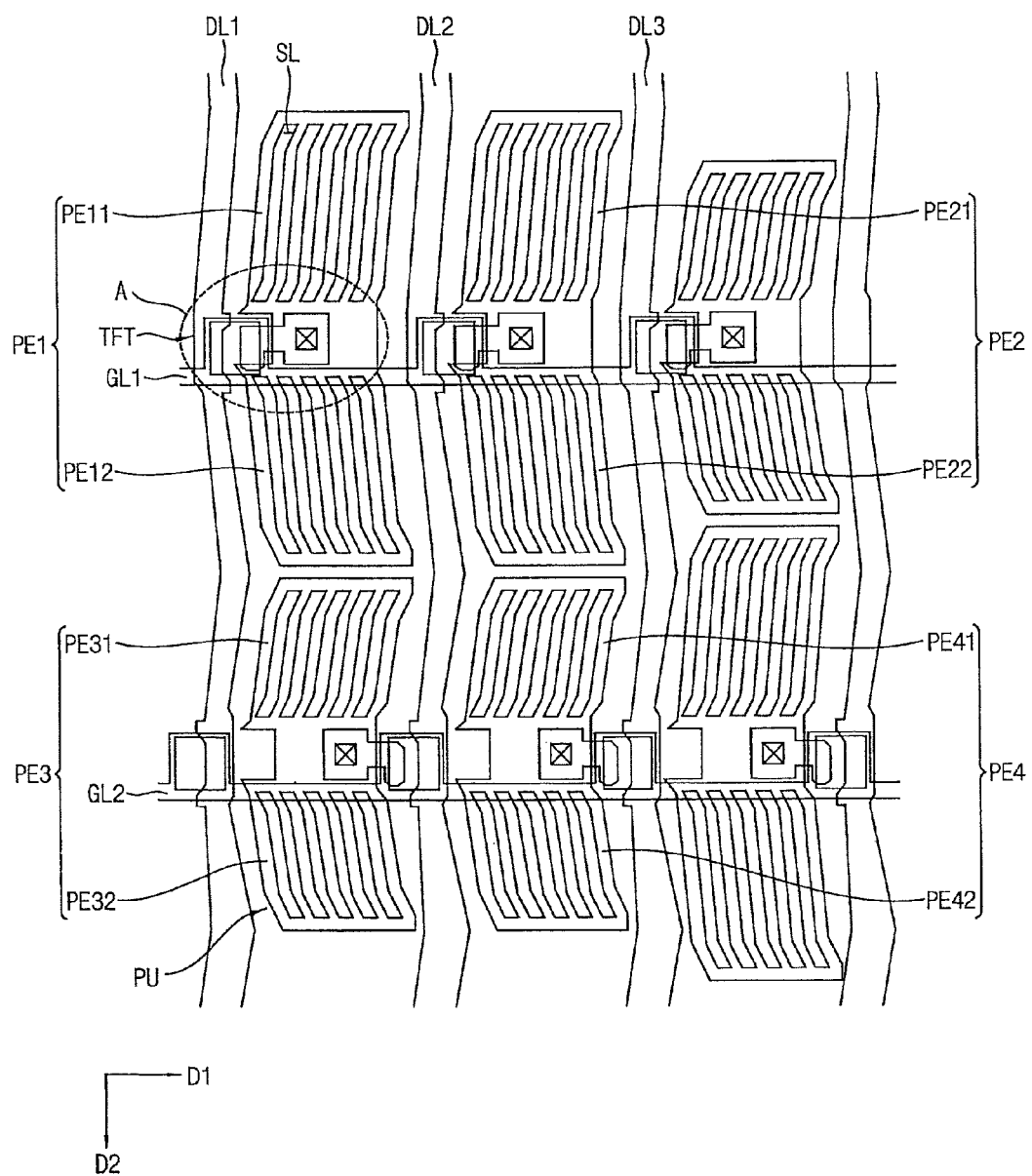
FIG. 2 is a top plan view illustrating an exemplary embodiment of a pixel structure of the liquid crystal display panel of FIG. 1.
Figure 3:
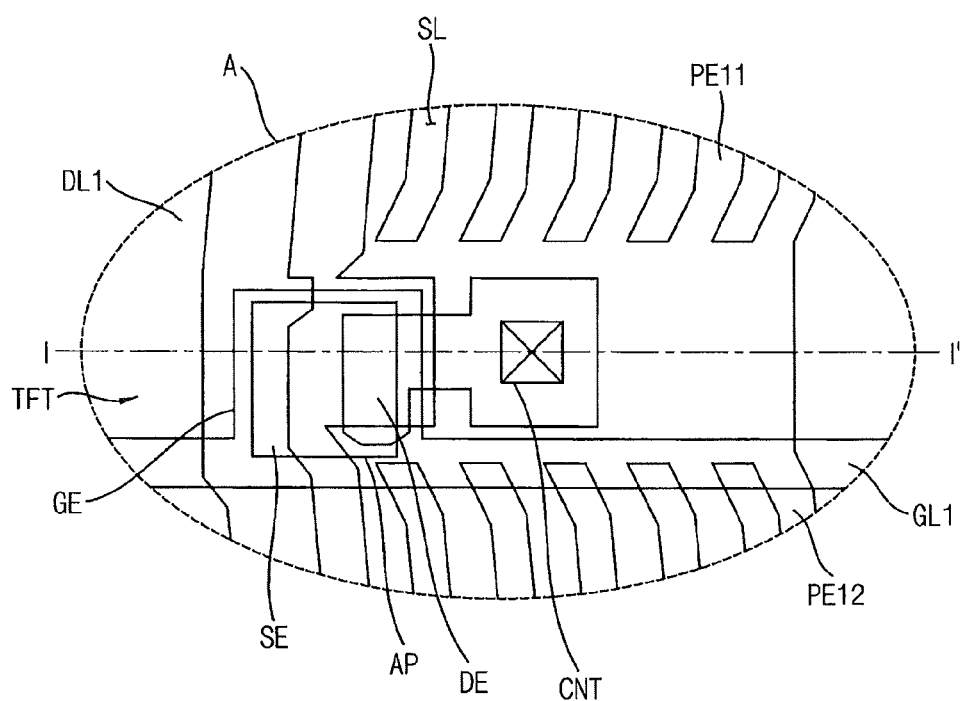
FIG. 3 is an enlarged top plan view illustrating a region 'A' of the pixel structure of FIG. 2.
Figure 4:
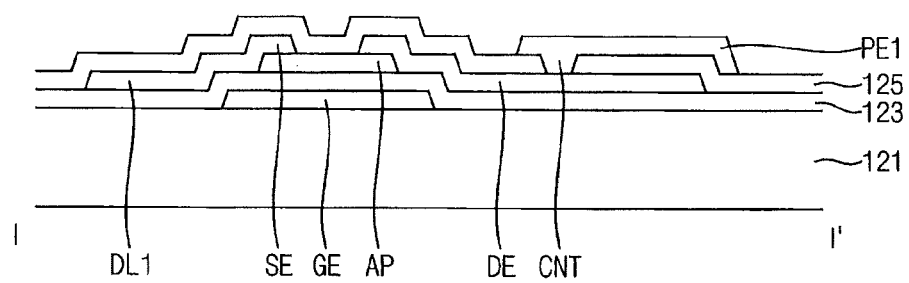
FIG. 4 is a cross-sectional view along line I-I' of FIG. 3.
Figure 5:
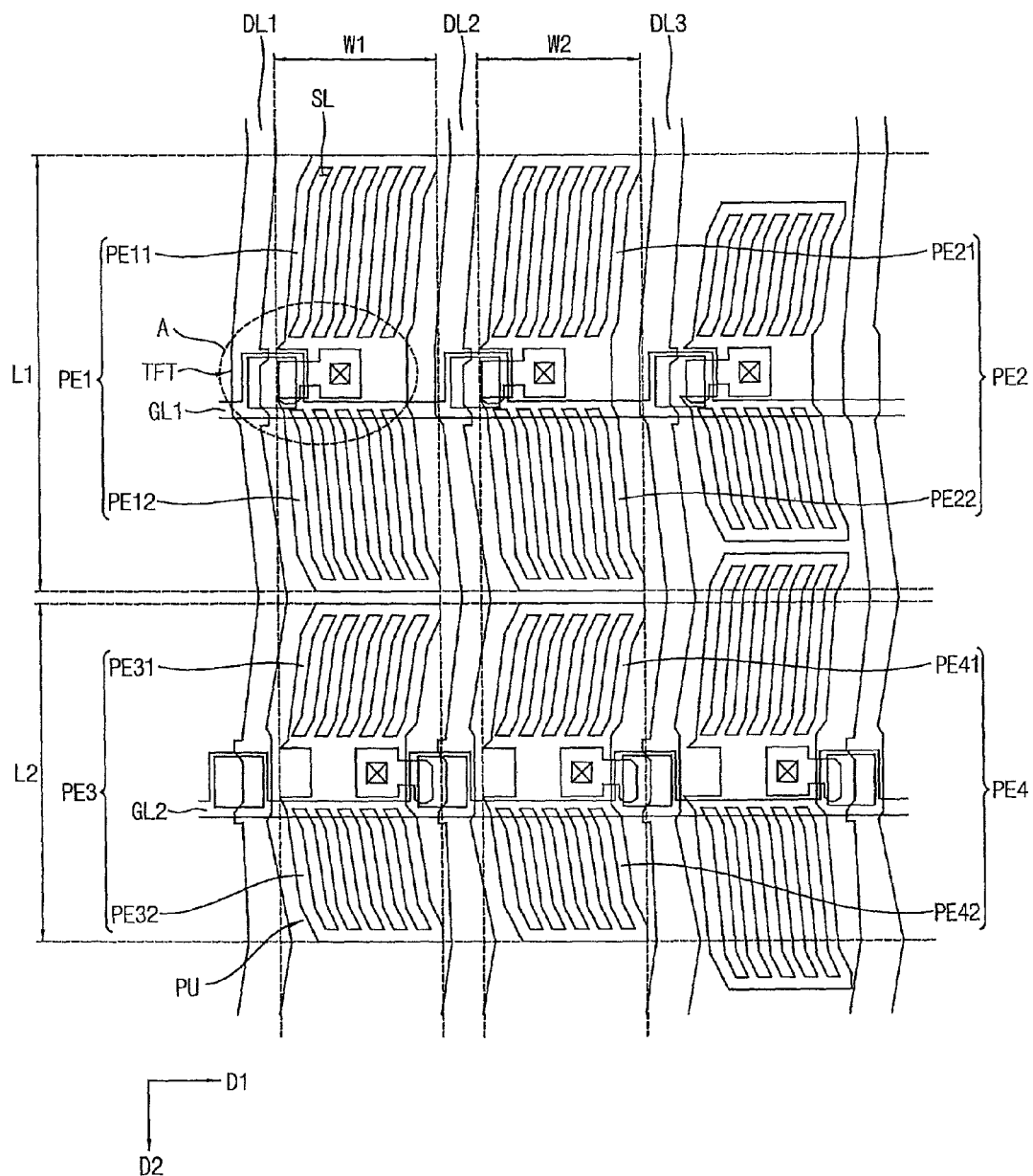
FIGS. 5 and 6 are top plan views illustrating exemplary embodiments of light transmitting areas of the liquid crystal display panel in FIG. 1.
Figure 6:
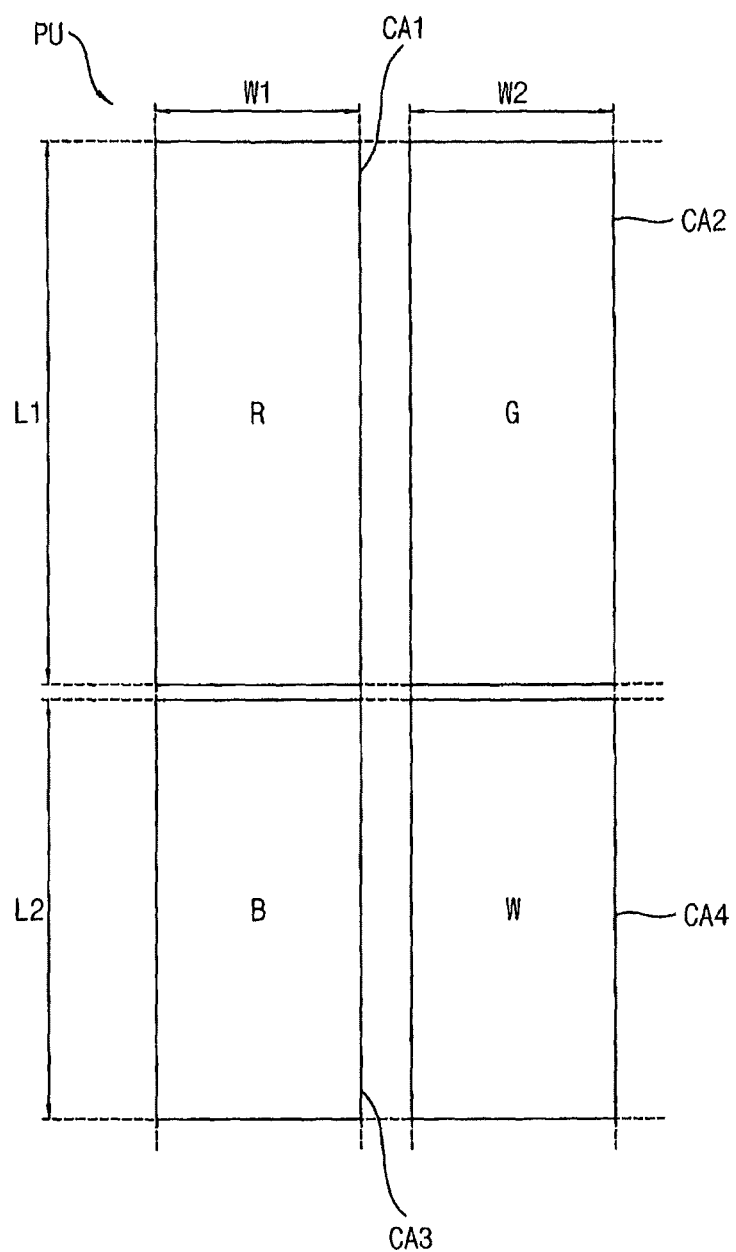

FIG. 1 is a perspective view illustrating an exemplary embodiment of a liquid crystal display panel according to the invention. FIG. 2 is a top plan view illustrating an exemplary embodiment of a pixel structure of the liquid crystal display panel of FIG. 1. FIG. 3 is an enlarged plan view illustrating a region 'A' of the pixel structure of FIG. 2. FIG. 4 is a cross-sectional view along line I-I' of FIG. 3. FIGS. 5 and 6 are plan views illustrating exemplary embodiments of light transmitting areas of the liquid crystal display panel in FIG. 1.

Referring to FIG. 1, an exemplary embodiment of a liquid crystal display panel 100 includes an array substrate 120, an opposing substrate 130 and a liquid crystal display layer 140.

The array substrate 120 may include a gate line GL provided in plural, a data line DL provided in plural, a switching element TFT provided in plural and a pixel electrode PE provided in plural. The switching elements TFT may electrically connect the pixel electrodes PE with the gate lines GL and the data lines DL. The pixel electrodes PE may define a plurality of sub-pixel areas.

The opposing substrate 130 may be opposite to and face the array substrate 120.

The liquid crystal layer 140 may be disposed between the array substrate 120 and the opposing substrate 130 facing each other.

One of the array substrate 120 and the opposing substrate 130 may include a color filter pattern overlapping the sub-pixel areas. In an exemplary embodiment, for example, the liquid crystal display panel 100 may have a color filter on array substrate ("COA") structure in which the color filter pattern is disposed in the array substrate 120. Alternatively, the color filter pattern may be disposed in the opposing substrate 130. The color filter pattern may include, e.g., a red filter, a green filter and a blue filter, etc. Alternatively, the color filter pattern may include a color phosphor or a nano-particle to convert backlight having a blue light or an ultraviolet waveband provided to the display panel into red light, green light, yellow light, etc. Hereinafter, transmitting areas of the red light, the green light, the blue light and a white light may be referred as a red area, a green area, a blue area and a white area, respectively.

One of the array substrate 120 and the opposing substrate 130 may include a light blocking pattern. The light blocking pattern may overlap a border line of the sub-pixel areas. In an exemplary embodiment, for example, the liquid crystal display panel 100 may have a black matrix on array substrate ("BOA") structure in which the light blocking pattern is disposed in the array substrate 120. Alternatively, the light blocking pattern may be disposed in the opposing substrate 130.

One of the array substrate 120 or the opposing substrate 130 may include a common electrode to form an electric field with the pixel electrodes PE. In an exemplary embodiment, for example, the liquid crystal display panel 100 may have a plane-to-line switching ("PLS") structure in which the common electrode is disposed in the array substrate 120 and horizontal electric fields formed by the pixel electrodes PE and the common electrode adjust alignments of liquid crystal molecules in the liquid crystal layer 140. In the PLS structure, the pixel electrodes PE or the common electrode may include a plurality of slits defined therein. Alternatively, the common electrode may be disposed in the opposing substrate 130.

The liquid crystal display panel 100 may receive an image signal from an image driving part 110.

The image driving part 110 may include a gate driving part 111 and a data driving part 113. The gate driving part 111 may be configured to output gate on/off voltages to the gate lines GL. As illustrated in FIG. 1, the gate driving part 111 and the data driving part 113 may be disposed as a tape carrier package ("TCP") relative to the liquid crystal display panel 100. Alternatively, the gate driving part 111 and/or the data driving part 113 may be integrated on and/or in the array substrate 120 of the liquid crystal display panel 100.

The data driving part 113 may be configured to output data voltages to the data lines DL.

As illustrated in FIGS. 2 to 4, an exemplary embodiment of the array substrate 120 of the liquid crystal display panel 100 according to the invention may include a base substrate 121, gate lines GL1 and GL2, a gate insulation layer 123, data lines DL1 to DL3, a passivation layer 125, pixel electrodes PE1 to PE4 and switching elements TFT. Each of the switching elements TFT may include a gate electrode GE, a source electrode SE, an active pattern AP and a drain electrode DE.

A display area of the liquid crystal display panel 100 may be divided by or into a plurality of unit pixels PU, each of which overlaps the pixel electrodes PE1 to PE4.

The base substrate 121 may include a transparent insulation material. In an exemplary embodiment, for example, the base substrate 121 may include glass, quartz, plastic, polyethylene terephthalate resin, polyethylene resin, polycarbonate resin, etc.

The gate lines GL1 and GL2 may be elongated to extend in a first direction D1 on the base substrate 121. The gate lines GL1 and GL2 may be arranged in a second direction D2 crossing the first direction D1. The gate lines GL1 and GL2 may include, e.g., aluminum (Al), gold (Au), silver (Ag), copper (Cu), iron (Fe), nickel (Ni), etc. These materials may be used alone or in a combination thereof. The gate lines GL1 and GL2 may include, e.g., indium doped zinc oxide ("IZO"), gallium doped zinc oxide ("GZO"), etc. The gate lines GL1 and GL2 may include a first gate line GL1 and a second gate line GL2 sequentially adjacent to each other along the second direction D2.

Each of the gate lines GL1 and GL2 may define the gate electrode GE such that the gate electrode GE is electrically connected to the respective gate line GL among the first and second gate lines GL1 and GL2. Each of the gate lines GL1 and GL2 may define the gate electrode GE provided in plural. The gate electrode GE may include, for example, the same material as that of the gate lines GL1 and GL2. In an exemplary embodiment for example, the gate electrode GE may be integrally formed with the respective gate line GL among the first and second gate lines GL1 and GL2.

The gate insulation layer 123 may be disposed on the base substrate 121 with the gate lines GL1 and GL2 and the gate electrode GE disposed thereon. The gate insulation layer 123 may include a transparent insulation material such as, for example, silicon oxide, silicon nitride, etc.

The active pattern AP may be disposed on the gate insulation layer 123 to overlap the gate electrode GE. The active pattern AP may include, e.g., indium (In), zinc (Zn), gallium (Ga), tin (Sn), hafnium (Hf), etc. In an exemplary embodiment, for example, the active pattern AP may include an oxide semiconductor pattern such as, e.g., indium gallium zinc oxide ("IGZO"), indium tin zinc oxide ("ITZO"), hafnium indium zinc oxide ("HIZO"), etc.

The data lines DL1 to DL3 may be disposed on the base substrate 121 with the active pattern AP disposed thereon. The data lines DL1 to DL3 may be elongated to extend in the second direction D2. The data lines DL1 to DL3 may be arranged in the first direction D1. In an exemplary embodiment, for example, the second direction D2 may be substantially perpendicular to the first direction D1. In an exemplary embodiment, the data lines DL1 to DL3 and the gate lines GL1 and GL2 may define the sub-pixel areas, but the invention is not limited thereto. The data lines DL1 to DL3 may include, e.g., the same material as that of the gate lines GL1 and GL2. In an exemplary embodiment, for example, the data lines DL1 to DL3 may include aluminum (Al), gold (Au), silver (Ag), copper (Cu), iron (Fe), nickel (Ni), etc. The data lines DL1 to DL3 may include a first data line DL1, a second data line DL2 and a third data line DL3 sequentially adjacent to one another along the first direction D1.

The source electrode SE may be disposed on the gate insulation layer 123 to overlap a first end portion of the active pattern AP. Each of the data lines DL1 to DL3 may define the source electrode SE such that the source electrode SE is electrically connected to the respective data line DL among the first to third data lines DL1 to DL3. Each of the data lines DL1 to DL3 may define the source electrode GE provided in plural. In an exemplary embodiment, for example, the source electrode SE may be integrally formed with the respective data line DL among the first to third data lines DL1 to DL3.

The drain electrode DE may be spaced apart from the source electrode SE. The drain electrode DE may be disposed on the gate insulation layer 123 to overlap a second end portion of the active pattern AP opposing the first end thereof. The drain electrode DE may include, e.g., the same material as that of the source electrode SE. In an exemplary embodiment, for example, the source electrode SE and the drain electrode DE may include aluminum (Al), gold (Au), silver (Ag), copper (Cu), iron (Fe), nickel (Ni), etc. The source electrode SE and the drain electrode DE may be in a same layer among layers of the array substrate disposed on the base substrate 121.

The passivation layer 125 may be disposed on the source electrode SE and the drain electrode DE. The passivation layer 125 may cover the source electrode SE and the drain electrode DE. The passivation layer 125 may include an inorganic insulation material or an organic insulation material. In an exemplary embodiment, for example, the passivation layer 125 may include the same material as that of the gate insulation layer 123. In an exemplary embodiment, for example, the passivation layer 125 may include silicon oxide, silicon nitride, etc.

The pixel electrodes PE1 to PE4 may be disposed on the passivation layer 125. The pixel electrodes PE1 to PE4 may include, e.g., a transparent conductive material. Each of the pixel electrodes PE1 to PE4 may be electrically connected to the drain electrode DE of a thin film transistor TFT at a contact hole CNT defined in the passivation layer 125.

The pixel electrodes PE1 to PE4 may include a first pixel electrode PE1 and a second pixel electrode PE2. The first pixel electrode PE1 may be electrically connected to the first gate line GL1 and the first data line DL1 through the switching element TFT. The second pixel electrode PE2 may be electrically connected to the first gate line GL1 and the second data line DL2 by the switching element TFT.

The pixel electrodes PE1 to PE4 may include a third pixel electrode PE3 and a fourth pixel electrode PE4. The third pixel electrode PE3 may be electrically connected to the second gate line GL2 and the first data line DL1 through the switching element TFT. The fourth pixel electrode PE4 may be electrically connected to the second gate line GL2 and the second data line DL2 through the switching element TFT.

Each of the pixel electrodes PE1 to PE4 may include a slit SL defined in plural therein. A length of the slit SL is elongated in an extension direction and is tilted toward a desired angle with respect to the first direction D1 and the second direction D2.

In addition, planar sizes of the pixel electrodes PE1 to PE4 may be different from one another. In an exemplary embodiment, for example, in the top plan view a size of the first pixel electrode PE1 may be greater than a size of the second pixel electrode PE2. The size of the second pixel electrode PE2 may be greater than a size of third pixel electrode PE3. The size of the third pixel electrode PE3 may be greater than a size of fourth pixel electrode PE4.

In exemplary embodiments, among a group of the first to fourth pixel electrodes PE1 to PE4, the first and second pixel electrodes PE1 and PE2 may be arranged along the first direction D1, and the third and fourth pixel electrodes PE3 and PE4 may be arranged along the first direction D1 while being adjacent to the first and second pixel electrodes PE1 and PE2 in the second direction D2.

In addition, the first to fourth pixel electrodes PE1 to PE4 may respectively correspond to first to fourth color areas. In an exemplary embodiment, for example, the first color area may be a red area R, and the second color area may be a green area G, and the third color area may be blue area B, and the fourth color area may be white area W.

The data lines DL1 to DL3 may be disposed between the pixel electrodes PE1 to PE4 arranged along the first direction D1. In an exemplary embodiment, for example, the first and third pixel electrodes PE1 and PE3 may be disposed between the first and second data lines DL1 and DL2, and the second and fourth pixel electrodes PE2 and PE4 may be disposed between the second and third data lines DL2 and DL3.

In addition, the same first gate line GL1 may cross both the first and second pixel electrodes PE1 and PE2, and the same second gate line GL2 may cross the third and fourth pixel electrodes PE3 and PE4.

The first and second color areas may be divided into a first upper color area and a first lower color area, and a second upper color area and a second lower color area by the first gate line GL1, respectively. The third and fourth color areas may be divided into a third upper color area and a third lower color area, and a fourth upper color area and a fourth lower color area by the second gate line GL2, respectively.

In addition, the first to fourth pixel electrodes PE1 to PE4 may include first to fourth upper pixel electrodes PE11, PE21, PE31 and PE41 respectively corresponding to the first to fourth upper color areas described above. The first to fourth pixel electrodes PE1 to PE4 may further include first to fourth lower pixel electrodes PE12, PE22, PE32 and PE42 respectively corresponding to the first to fourth lower color areas described above.

In an exemplary embodiment, for example, the first upper pixel electrode PE11 and the first lower pixel electrode PE12 may be arranged symmetrically with respect to the first gate line GL1, and the second upper pixel electrode PE21 and the second lower pixel electrode PE22 may be arranged symmetrically with respect to the first gate line GL1.

In addition, the third upper pixel electrode PE31 and the third lower pixel electrode PE32 may be arranged symmetrically with respect to the second gate line GL2, and the fourth upper pixel electrode PE41 and the fourth lower pixel electrode PE42 may be arranged symmetrically with respect to the second gate line GL2.

As illustrated in FIGS. 5 and 6, the exemplary embodiment of the liquid crystal display panel 100 according to the invention may include the unit pixel PU provided in plural. In the top plan view, the unit pixels PU may be arranged in a matrix shape along the first direction D1 and the second direction D2. Each of the unit pixels PU may collectively include the red area R through which red light transmits, the green area G through which green light transmits, the blue area B through which blue light transmits and the white area W through which white light transmits.

The unit pixel PU may include first to fourth color areas CA1 to CA4. The first color area CA1 may be the red area R, the second color area CA2 may be the green area G, the third color area CA3 may be the blue area B and the fourth color area CA4 may be the white area W. An order of colors in the first to fourth color areas CA1 to CA4 may be differently determined in other exemplary embodiments. In an exemplary embodiment, for example, the first to fourth color areas CA1 to CA4 may have an arbitrary order in which the red area R, the green area G, the blue area B and the white area W are arranged.

The first to fourth color areas CA1 to CA4 may overlap the first to fourth pixel electrodes PE1 to PE4, respectively. In an exemplary embodiment, for example, the first color area CA1 may overlap the first pixel electrode PE1, the second color area CA2 may overlap the second pixel electrode PE2, the third color area CA3 may overlap the third pixel electrode PE3 and the fourth color area CA4 may overlap the fourth pixel electrode PE4.

Lengths L1 of the first and second pixel electrodes PE1 and PE2 may be substantially the same as each other, and lengths L2 of the third and fourth pixel electrodes PE3 and PE4 may be substantially the same as each other.

In addition, the lengths L1 of the first and second pixel electrodes PE1 and PE2 may be greater than the lengths L2 of the third and fourth pixel electrodes PE3 and PE4.

Widths W1 of the first and third pixel electrodes PE1 and PE3 may be substantially the same as each other and widths W2 of the second and fourth pixel electrodes PE2 and PE4 may be substantially the same as each other. The widths W1 of the first and third pixel electrodes PE1 and PE3 may be greater than the widths W2 of the second and fourth pixel electrodes PE2 and PE4.

The first and second color areas CA1 and CA2 may be arranged along the first direction D1, and the third and fourth color areas CA3 and CA4 may be arranged along the first direction D1 and adjacent to the first and second color areas CA1 and CA2 in the second direction D2.

Lengths L1 of the first and second color areas CA1 and CA2 may be substantially the same as each other, and lengths L2 of the third and fourth color areas CA3 and CA4 may be substantially the same as each other. The lengths L1 of the first and second color areas CA1 and CA2 may be greater than the lengths L2 of the third and fourth color areas CA3 and CA4.

Widths W1 of the first and third color areas CA1 and CA3 may be substantially the same as each other and widths W2 of the second and fourth color areas CA2 and CA4 may be substantially the same as each other. The widths W1 of the first and third color areas CA1 and CA3 may be greater than the widths W2 of the second and fourth color areas CA2 and CA4.

The first to fourth color areas CA1 to CA4 may be disposed between the first to third data lines DL1 to DL3, and the first and second gate lines GL1 and GL2 may cross the first to fourth color areas CA1 to CA4.

The first and third color areas CA1 and CA3 may be disposed between the first and second data lines DL1 and DL2, and the second and fourth color areas CA2 and CA4 may be disposed between the second and third data lines DL2 and DL3.

The same first gate line GL1 may be arranged to cross both the first and second color areas CA1 and CA2, and the same second gate line GL2 may be arranged to cross both the third and fourth color areas CA3 and CA4.

According to one or more exemplary embodiment of the liquid crystal display panel 100 in accordance with the invention, in a liquid crystal display panel having a RGBW pixel structure, display quality thereof can be improved.

In particular, by a structure in which R, G, B and W pixel area sizes decrease gradually, greenish problem can be reduced and total luminance and transmittance can be enhanced.

Also, the same first gate line GL1 may be arranged to cross the R pixel and G pixel, and the same second gate line GL2 may be arranged to cross the B pixel and W pixel such that difference of capacitance by the data line and the gate line can be reduced.

By the above-described structure in which every pixel has uniform electrical characteristics, the display quality of the liquid crystal display panel can be improved.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages of the invention. Accordingly, all such modifications are intended to be included within the scope of the exemplary embodiments as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A liquid crystal display substrate comprising:
   a plurality of gate lines each extending in a first direction;
   a plurality of data lines each extending in a second direction crossing the first direction;
   a plurality of switching elements respectively electrically connected to a gate line among the plurality of gate lines and a data line among the plurality of data lines; and
   a plurality of pixel electrodes electrically connected to the plurality of switching elements, respectively,
   wherein the pixel electrodes include:
      a first pixel electrode connected to a first gate line and to a first data line;
      a second pixel electrode connected to the first gate line to which the first pixel electrode is connected and to a second data line adjacent to the first data line;
      a third pixel electrode connected to a second gate line adjacent to the first gate line and to the first data line to which the first pixel electrode is connected; and
      a fourth pixel electrode connected to the second gate line to which the third pixel electrode is connected and to the second data line to which the second pixel electrode is connected,
   wherein the first gate line overlaps the first and second pixel electrodes, and the second gate line overlaps the third and fourth pixel electrodes, and
   wherein planar sizes of the first, second, third and fourth pixel electrodes are different from one another.

2. The liquid crystal display substrate of claim 1, wherein the first and second pixel electrodes are arranged along the first direction, and
   the third and fourth pixel electrodes are arranged along the first direction and are adjacent to the first and second pixel electrodes along the second direction.

3. The liquid crystal display substrate of claim 2, wherein in the second direction,
      lengths of the first and second pixel electrodes are substantially the same as each other, and lengths of the third and fourth pixel electrodes are substantially the same as each other, and
      the lengths of the first and second pixel electrodes are greater than the lengths of the third and fourth pixel electrodes, and
   in the first direction,
      widths of the first and third pixel electrodes are substantially the same as each other, and widths of the second and fourth pixel electrodes are substantially the same as each other, and
      the widths of the first and third pixel electrodes are greater than widths of the second and fourth pixel electrodes.

4. The liquid crystal display substrate of claim 3, wherein in order, the first, second, third and fourth pixel electrodes correspond to first, second, third and fourth color areas.

5. The liquid crystal display substrate of claim 4, wherein the first, second, third and fourth color areas are red, green, blue and white areas, respectively.

6. The liquid crystal display substrate of claim 4, wherein pixel electrodes adjacent in the second direction are disposed between two data lines adjacent in the first direction.

7. The liquid crystal display substrate of claim 6, wherein the first and third pixel electrodes adjacent in the second direction are disposed between the first and second data lines adjacent in the first direction, and
   the second and fourth pixel electrodes adjacent in the second direction are disposed between the second data line and a third data line adjacent in the first direction.

8. The liquid crystal display substrate of claim 4, wherein the first color area is divided into a first upper color area and a first lower color area by the first gate line,
   the second color area is divided into a second upper color area and a second lower color area by the first gate line,
   the third color area is divided into a third upper color area and a third lower color area by the second gate line, and
   the fourth color area is divided into a fourth upper color area and a fourth lower color area by the second gate line.

9. The liquid crystal display substrate of claim 8, wherein each of the first to fourth pixel electrodes defines:

a respective one of first to fourth upper pixel electrodes corresponding to the first to fourth upper color areas, and a respective one of first to fourth lower pixel electrodes corresponding to the first to fourth lower color areas.

10. The liquid crystal display substrate of claim 9, wherein the first upper pixel electrode and the first lower pixel electrode are symmetric with respect to the first gate line, the second upper pixel electrode and the second lower pixel electrode are symmetric with respect to the first gate line, the third upper pixel electrode and the third lower pixel electrode are symmetric with respect to the second gate line, and the fourth upper pixel electrode and the fourth lower pixel electrode are symmetric with respect to the second gate line.

11. A liquid crystal display panel comprising:

a unit pixel provided in plural and comprising a first color area, a second color area, a third color area and a fourth color area;

a plurality of gate lines each extending in a first direction;

a plurality of data lines each extending in a second direction crossing the first direction;

a plurality of switching elements respectively electrically connected to a gate line among the plurality of gate lines and a data line among the plurality of data lines; and a plurality of pixel electrodes electrically connected to the plurality of switching elements, respectively, wherein the pixel electrodes include:
　a first pixel electrode connected to a first gate line and to a first data line;
　a second pixel electrode connected to the first gate line to which the first pixel electrode is connected and to a second data line adjacent to the first data line;
　a third pixel electrode connected to a second gate line adjacent to the first gate line and to the first data line to which the first pixel electrode is connected; and
　a fourth pixel electrode connected to the second gate line to which the third pixel electrode is connected and to the second data line to which the second pixel electrode is connected, wherein the first gate line overlaps the first and second pixel electrodes and, the second gate line overlaps the third and fourth pixel electrodes, wherein the first to fourth pixel electrodes correspond to the first to fourth color areas of the unit pixel, respectively, and wherein planar sizes of the first to fourth pixel electrodes are different from one another.

12. The liquid crystal display panel of claim 11, wherein the first and second color areas are arranged along the first direction, and the third and fourth color areas are arranged along the first direction and are adjacent to the first and second color areas along the second direction.

13. The liquid crystal display panel of claim 12, wherein in the second direction, lengths of the first and second color areas are substantially the same as each other, and lengths of the third and fourth color areas are substantially the same as each other, and the lengths of the first and second color areas are greater than the lengths of the third and fourth color areas, and in the first direction,
　widths of the first and third color areas are substantially the same as each other, and widths of the second and fourth color areas are substantially the same as each other, and
　widths of the first and third color areas are greater than the widths of the second and fourth color areas.

14. The liquid crystal display panel of claim 13, wherein in order, the first to fourth color areas are red, green, blue and white areas.

15. The liquid crystal display panel of claim 12, wherein among the first to fourth color areas of the unit pixel, color areas adjacent in the second direction are disposed between two data lines adjacent in the first direction.

16. The liquid crystal display panel of claim 15, wherein the first and third color areas adjacent in the second direction are disposed between the first and second data lines adjacent in the first direction, and the second and fourth color areas adjacent in the second direction are disposed between the second data line and a third data line adjacent in the first direction.

17. The liquid crystal display panel of claim 15, wherein the first gate line overlaps the first and second color areas, and the second gate line overlaps the third and fourth color areas.

18. The liquid crystal display panel of claim 17, wherein the first color area is divided into a first upper color area and a first lower color area by the first gate line, the second color area is divided into a second upper color area and a second lower color area by the first gate line, the third color area is divided into a third upper color area and a third lower color area by the second gate line, and the fourth color area is divided into a fourth upper color area and a fourth lower color area by the second gate line.

19. The liquid crystal display panel of claim 18, wherein each of the first to fourth pixel electrodes defines:

a respective one of first to fourth upper pixel electrodes corresponding to the first to fourth upper color areas, and a respective one of first to fourth lower pixel electrodes corresponding to the first to fourth lower color areas.

20. The liquid crystal display panel of claim 19, wherein the first upper pixel electrode and the first lower pixel electrode are symmetric with respect to the first gate line, the second upper pixel electrode and the second lower pixel electrode are symmetric with respect to the first gate line, the third upper pixel electrode and the third lower pixel electrode are symmetric with respect to the second gate line, and the fourth upper pixel electrode and the fourth lower pixel electrode are symmetric with respect to the second gate line.

* * * * *